(12) United States Patent
Saxod et al.

(10) Patent No.: US 12,557,424 B2
(45) Date of Patent: Feb. 17, 2026

(54) ELECTRONIC DEVICE COMPRISING A CARRIER SUBSTRATE AND AN ENCAPSULATING COVER MOUNTED ON THE CARRIER SUBSTRATE, AND CORRESPONDING MOUNTING PROCESS

(71) Applicant: STMicroelectronics (Grenoble 2) SAS, Grenoble (FR)

(72) Inventors: Karine Saxod, Les Marches (FR); Nicolas Mastromauro, Lumbin (FR)

(73) Assignee: STMicroelectronics (Grenobles 2) SAS, Grenoble (FR)

( * ) Notice: Subject to any disclaimer, the term of this patent is extended or adjusted under 35 U.S.C. 154(b) by 401 days.

(21) Appl. No.: 18/136,633

(22) Filed: Apr. 19, 2023

(65) Prior Publication Data
US 2023/0253519 A1    Aug. 10, 2023

Related U.S. Application Data

(62) Division of application No. 17/090,461, filed on Nov. 5, 2020, now Pat. No. 11,664,475.

(30) Foreign Application Priority Data

Nov. 8, 2019  (FR) ...................................... 1912566

(51) Int. Cl.
*H10F 55/10*    (2025.01)
*G01S 7/484*    (2006.01)
(Continued)

(52) U.S. Cl.
CPC ............ *H10F 55/165* (2025.01); *G01S 7/484* (2013.01); *G01S 7/4865* (2013.01); *H10F 71/00* (2025.01);
(Continued)

(58) Field of Classification Search
CPC ........ H10F 55/165; H10F 71/00; H10F 77/50; G01S 7/484; G01S 7/4865; H10H 20/01; H10H 20/852
See application file for complete search history.

(56) References Cited

U.S. PATENT DOCUMENTS 6,122,009 A    9/2000  Ueda
2002/0131782 A1  9/2002  Yamaguchi et al.
(Continued)

FOREIGN PATENT DOCUMENTS

CN    103972370 A    8/2014
CN    213546324 U    6/2021
(Continued)

OTHER PUBLICATIONS

First Office Action and Search Report for counterpart CN Appl. No. 202011230917.2, report dated Sep. 14, 2024, 6 pgs.
(Continued)

*Primary Examiner* — Matthew L Reames
(74) *Attorney, Agent, or Firm* — Crowe & Dunlevy LLC

(57) ABSTRACT

A carrier substrate is configured to carry at least one electronic chip and includes a mounting front face. An encapsulating cover is mounted on the front face of the carrier substrate through a mounting. This mounting includes at least one seating surface through which the cover and the carrier substrate make contact. At least one adhesive bead is located elsewhere than the seating surface in order to securely fasten the encapsulation cover and the carrier substrate.

16 Claims, 3 Drawing Sheets

(51) Int. Cl.
  *G01S 7/4865* (2020.01)
  *H10F 71/00* (2025.01)
  *H10F 77/50* (2025.01)
  *H10H 20/01* (2025.01)
  *H10H 20/852* (2025.01)

(52) U.S. Cl.
  CPC ............. *H10F 77/50* (2025.01); *H10H 20/01* (2025.01); *H10H 20/852* (2025.01); *H10H 20/0362* (2025.01)

(56) References Cited

U.S. PATENT DOCUMENTS

| | | |
|---|---|---|
| 2003/0184885 A1 | 10/2003 | Tansho et al. |
| 2014/0211472 A1 | 7/2014 | Hata |
| 2019/0157469 A1 | 5/2019 | Saxod et al. |

FOREIGN PATENT DOCUMENTS

| | | |
|---|---|---|
| EP | 1351316 A2 | 10/2003 |
| JP | 2003035855 A | 2/2003 |

OTHER PUBLICATIONS

INPI Search Report and Written Opinion for FR 1912566 dated Jun. 10, 2020 (10 pages).

ELECTRONIC DEVICE COMPRISING A CARRIER SUBSTRATE AND AN ENCAPSULATING COVER MOUNTED ON THE CARRIER SUBSTRATE, AND CORRESPONDING MOUNTING PROCESS

CROSS REFERENCE TO RELATED APPLICATIONS

This application is a divisional of U.S. patent application Ser. No. 17/090,461, filed Nov. 5, 2020, which claims the priority benefit of French Application for Patent No. 1912566, filed on Nov. 8, 2019, the contents of which are hereby incorporated by reference in their entireties to the maximum extent allowable by law.

TECHNICAL FIELD

Embodiments and modes of implementation relate to microelectronics and, in particular, to the field of electronic packages comprising an encapsulating cover mounted on a carrier substrate.

BACKGROUND

A carrier substrate is typically used to support and connect an electronic chip and the encapsulating cover for enclosing the chip, and to hold a handleable device protected from exterior conditions.

The mounting of the encapsulating cover on the carrier substrate conventionally comprises placing an adhesive bead, for example on the periphery of the carrier substrate, and securely fastening the cover and the substrate by contact with the adhesive bead.

The thickness occupied by the adhesive bead (or BLT for Bound Line Thickness) may vary slightly from one embodiment to the next and the BLT thickness is limited in size in order to maintain a given precision in the vertical positioning of the cover on the substrate. For example, to maintain a precision in the vertical positioning of plus or minus 10 μm (microns), the BLT thickness of the adhesive bead is limited to 15 μm.

This being so, it may be desirable to benefit from a larger adhesive-bead thickness without decreasing the precision of the vertical positioning, and/or to benefit from a higher precision.

SUMMARY

According to one aspect, an electronic device is proposed, said device comprising a carrier substrate configured to carry at least one electronic chip and having a mounting front face and an encapsulating cover mounted on said front face of the carrier substrate through a mounting comprising at least one seating surface through which said cover and said substrate make contact, and at least one adhesive bead located elsewhere than the seating surface in order to securely fasten said cover and said carrier substrate.

Therefore, the precision of the vertical positioning is defined by the contact of the substrate and of the cover through the seating surfaces, and is not dependent on the penetration of the cover into the thickness of the adhesive bead. Thus, it is possible to provide a larger thickness of BLT adhesive bead, for example 30 μm, while benefiting from a very high precision in the vertical positioning, for example one higher than 10 μm.

According to one embodiment, the cover has at least one through-passage housing an optical system facing the through-passage.

Thus, the optical system may benefit from a better vertical precision and have needs in terms of precision in vertical positioning that are not constrained by the thickness of the BLT adhesive bead.

Therefore, the optical system may be more complex in order to achieve a higher performance than conventional systems, and, according to one embodiment, said at least one chip is mounted on said mounting front face and is housed in a chamber located in the cover and said optical system is configured to modify the properties of an incident light signal coming from outside the cover and directed towards a surface of said chip, the configuration of the optical system, i.e., the way in which it modifies the properties of the incident signal, varying as a function of the distance separating the surface of the chip from the optical system.

According to one embodiment, said at least one seating surface is located set back towards the interior with respect to an exterior lateral border of the carrier substrate and/or with respect to an exterior lateral border of the encapsulating cover, so that the adhesive bead fills a space located between the exterior lateral borders and the seating surface.

In other words, the adhesive bead is placed beforehand on the side of the seating surface in order to not be imprisoned between the portions making contact of the cover and of the carrier substrate. This allows a correspondingly higher precision.

According to one embodiment, said encapsulating cover has a rear edge to which said adhesive bead is fastened, and comprises at least one seating foot having a rear surface that protrudes from said rear edge, said seating surface comprising the rear surface of the seating foot making contact with the front face of the carrier substrate.

According to another embodiment, said mounting front face of the carrier substrate comprises at least one seating base having a front surface that protrudes from said mounting front face, said seating surface comprising the front surface of said seating base making contact with the encapsulating cover.

According to one embodiment, the device comprises a light-emitting electronic chip configured to emit a light signal and a light-receiving electronic chip configured to detect an incident light signal, the two chips being mounted on the mounting front face and housed in at least one chamber of the cover, the light-emitting chip and the light-receiving chip being configured to interact so as to measure a distance by time-of-flight of the light signal emitted then incident after a reflection.

Measurement by time-of-flight is a term used to designate the measurement of the time passed between the emission of a light signal and the reception of this signal after reflection or scatter of the signal from a distant surface. Multiplying the speed of light by this time returns the distance between the distant surface and the zone of the emission/reception.

According to another aspect, a process for fabricating an electronic device comprises mounting an encapsulating cover on a carrier substrate configured to carry at least one electronic chip and having a mounting front face, the mounting comprising bringing the cover into contact with the carrier substrate through at least one seating surface, and securely fastening the cover to the carrier substrate by means of at least one adhesive bead placed beforehand elsewhere than the seating surface.

According to one mode of implementation, the process further comprises the step of providing at least one through-passage in the cover and of housing, in the cover, an optical system facing the through-passage, before said mounting.

According to one mode of implementation, the process further comprises mounting said at least one chip on the mounting front face and housing said at least one chip in a chamber provided in the cover, said optical system being configured to modify the properties of an incident light signal coming from outside the cover and directed towards a surface of the chip in a way dependent on the distance separating the surface of the chip from the optical system.

According to one mode of implementation, the adhesive bead is placed so as to fill a space located between said at least one seating surface, which is located set back towards the interior with respect to an exterior lateral border of the carrier substrate and/or with respect to an exterior lateral border of the encapsulating cover.

According to one mode of implementation, the method further comprises producing, in said encapsulating cover, at least one seating foot having a rear surface that protrudes from a rear edge of said cover, said at least one seating surface, through which the cover is brought into contact with the carrier substrate, comprising said rear surface of the seating foot, and placing said adhesive bead on said rear edge of the cover.

According to one mode of implementation, the process further comprises producing, in the carrier substrate, at least one seating base having a front surface that protrudes from said mounting front face, said at least one seating surface, through which the cover is brought into contact with the carrier substrate, comprising said front surface of the seating base, and placing the adhesive bead on a portion of said mounting front face of the carrier substrate.

According to one mode of implementation, the process further comprises mounting a light-emitting chip configured to emit a light signal and a light-receiving chip configured to detect an incident light signal on the mounting front face and in at least one chamber of the cover, the light-emitting chip and the light-receiving chip being configured to interact so as to measure a distance by time-of-flight of the light signal emitted then incident after a reflection.

BRIEF DESCRIPTION OF THE DRAWINGS

Other advantages and features of the invention will become apparent on examining the detailed description of completely non-limiting embodiments and modes of implementation and the appended drawings, in which.

DETAILED DESCRIPTION

Figure 1:
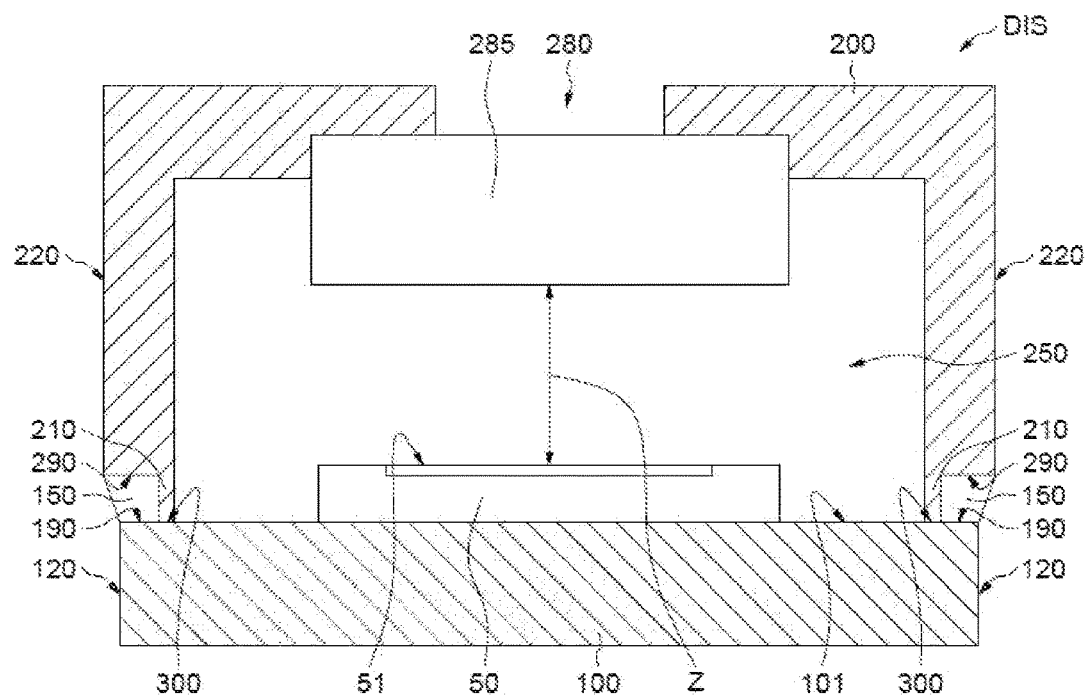
FIG. 1 is a cross-sectional view of an example of an embodiment of an electronic device.

FIG. 1 illustrates a cross-sectional view of an example of an embodiment of an electronic device DIS comprising a carrier substrate 100 having a mounting front face 101, and an encapsulating cover 200 mounted on the mounting front face 101.

The carrier substrate 100 is configured to carry at least one electronic integrated circuit (IC) chip 50 and, for example, to make electrical connections between terminals of the chip 50 and the exterior of the device DIS.

The chip 50 is mounted on the mounting front face 101 of the substrate 100. The encapsulating cover 200 comprises a chamber 250 defining a free space for accommodating the chip 50.

For example, the cover 200 has at least one through-passage 280 between the exterior of the cover 200 and the chamber 250, and houses an optical system 285 facing the through-passage 280.

The through-passage 280 of the cover 200 and the optical system 285 are aligned along a vertical optical axis, i.e., perpendicular to the mounting front face 101, and centered on a surface 51 of the chip 50, for example a photosensitive surface.

The optical system 285 may be configured to modify the properties of an incident light signal coming from outside the cover 200 and directed towards the photosensitive surface 51, for example in order to focus the light on the surface 51 and to filter certain wavelengths.

As will become apparent below, the mounting of the cover 200 and of the substrate 100 allows the optical system 285 to be designed so that its effect depends on the distance Z separating the photosensitive surface 51 from the optical system 285, in the direction of the optical axis.

Specifically, the cover 200 is mounted on the front face 101 of the carrier substrate 100 during a mounting phase offering a very high vertical precision.

The mounting phase comprises bringing the cover 200 into contact with the carrier substrate 100 through at least one seating surface 300, and securely fastening the cover to the carrier substrate by means of at least one adhesive bead 150 placed beforehand elsewhere than on the seating surface 300.

Thus, the thickness of the adhesive bead does not define the distance Z between the surface 51 of the chip 50 and the optical system 285.

To define the distance Z between the surface 51 of the chip 50 and the optical system 285, the encapsulating cover 200 comprises a plurality of separate seating protrusions (referred to in this implementation as "seating feet") 210 that protrude from a rear edge 290 of the cover 200 and that are configured to be seated in contact with the front face 101 of the substrate 100.

Thus, the precision of the vertical positioning of the optical system 285 with respect to the surface 51 of the chip 50 is defined by the precision of the fabrication of the cover 200 (and in particular the seating feet of the cover). Typically, the cover 200 is made from plastic by injection molding, which is a well-known and very reliable technique.

The rear edge 290 of the cover 200 is moreover provided to accommodate the adhesive bead 150.

The seating surface 300 through which the cover 200 and the substrate 100 make contact is thus formed by rear surfaces 211 of the seating feet 210 of the cover 200. Of course, the rear surface 211 of a seating foot 210 is the frontal surface of the protruding portion, i.e., the surface protruding parallel to the rear edge 290 of the cover 200.

The seating surfaces 300 are advantageously located set back towards the interior with respect to the exterior lateral border 120 of the carrier substrate 100, and also with respect to the exterior lateral border 220 of the encapsulating cover 200.

Of course, the interior of the cover 200 is directed towards the chamber 250.

Specifically, the exterior lateral borders 120, 220 of the substrate and of the cover, respectively, are not necessarily aligned in a common plane. Irrespectively, the seating surfaces 300 are advantageously located set back towards the interior with respect to each exterior lateral border 120, 220, so as to leave an open space on the exterior and having surfaces 190, 290 to be bonded.

Thus, the open space on the exterior between the seating feet 210 and each of the exterior borders 120, 220 of the substrate 100 and of the cover 200 is provided to be filled by the adhesive bead 150, in contact in particular with the rear edge 290 of the cover 200 and with one portion 190 of the front face 101 of the substrate 100.

Figure 2:
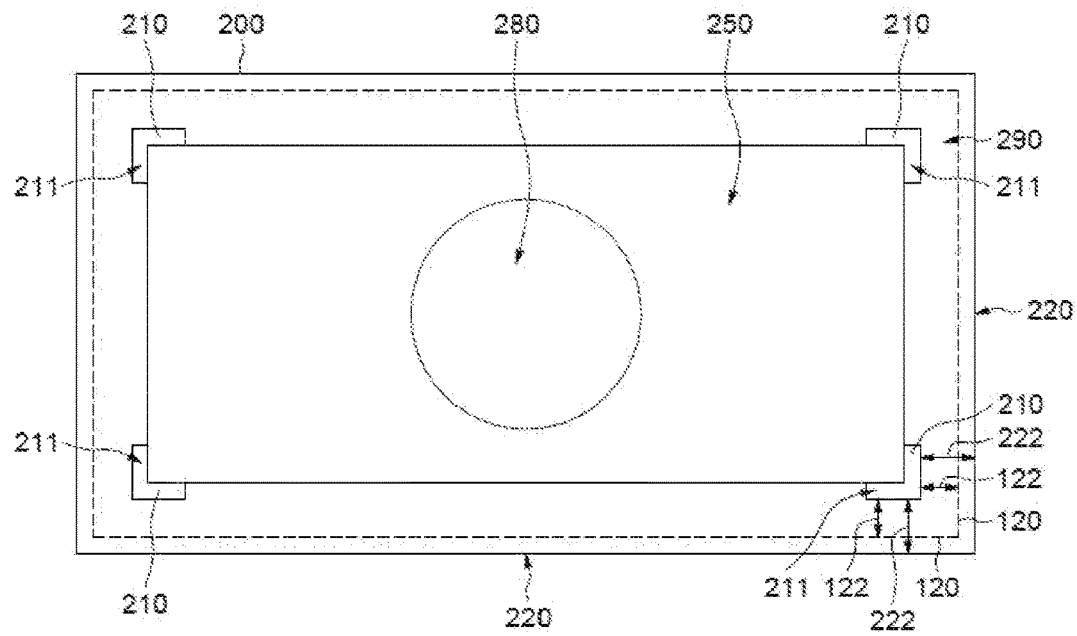
FIG. 2 shows a view of the bottom of an encapsulating cover.

In this respect, reference is made to FIG. 2.

FIG. 2 shows a view of the bottom of the encapsulating cover 200. The bottom of the encapsulating cover 200 in this example is the side of the cover 200 that makes contact with the front face 101 of the carrier substrate 100.

In this example, the seating feet 210 have a surface 211 in the shape of an L that protrudes with respect to the rear edge 290, so as to closely follow the shape of the ridges of the cover 200 at the intersection of two exterior faces 220. The feet are nevertheless located set back towards the interior 222 with respect to said exterior faces 220 and ridges.

Provision is made for the amount by which the feet are set back towards the interior 222 to be sufficiently large to leave a space 122 between the seating surface 300 (FIG. 1), i.e. the rear surface 211 of the feet 210, and the exterior border 120 of the carrier substrate 100, in order in particular to accommodate the adhesive bead 150 (FIG. 1).

In the example illustrated in FIG. 2, the seating feet 210 are further positioned plumb with the interior faces of the cover 200 delineating the chamber 250 and closely follow the corners of the chamber 250.

Of course, the seating feet 210 of the cover 200 may be positioned differently depending on the requirements. Advantageously, the seating feet 210 are nevertheless configured to leave a space allowing the adhesive bead 150 to be accommodated, without overflow onto the rear surfaces 211 of the feet 210, i.e. the seating surface 300.

In practice, an adhesive residue will possibly be present between the cover 200 and the substrate 100 on the seating surface 300. Such an adhesive residue will have a negligible thickness with respect to the requirements in terms of vertical precision of the mounting.

The seating feet 210 of the cover 200 may also have any other shape, for example a square or rectangular shape, or even a cross shape.

Figure 3:
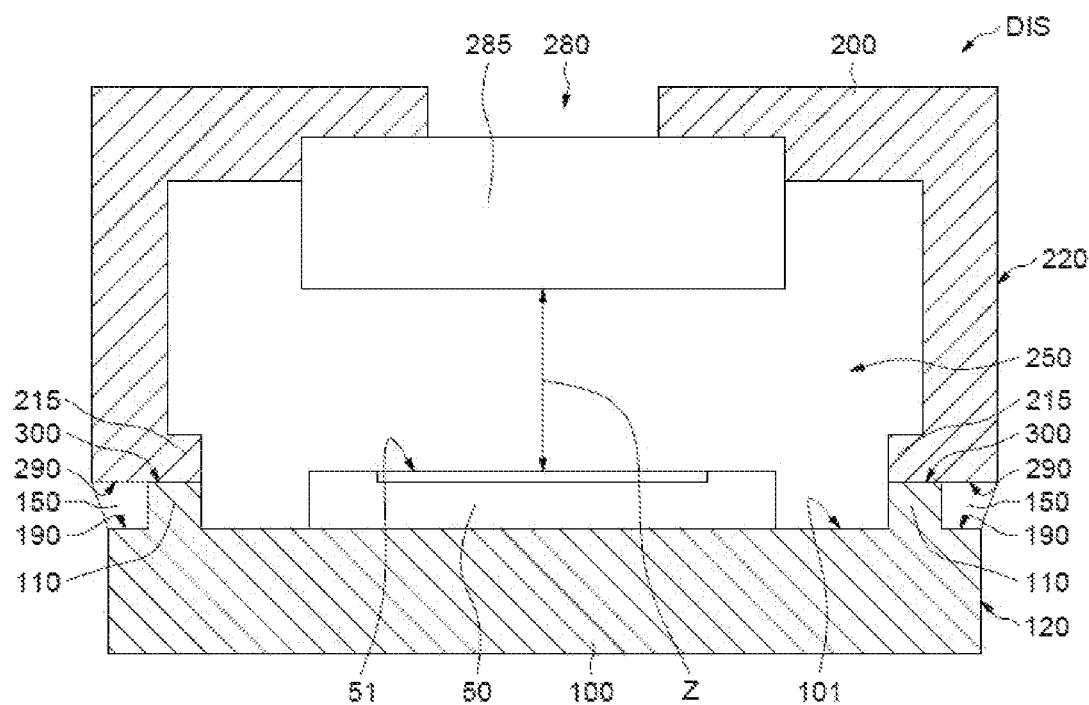
FIG. 3 is a cross-sectional view of another example embodiment of an electronic device.
Figure 4:
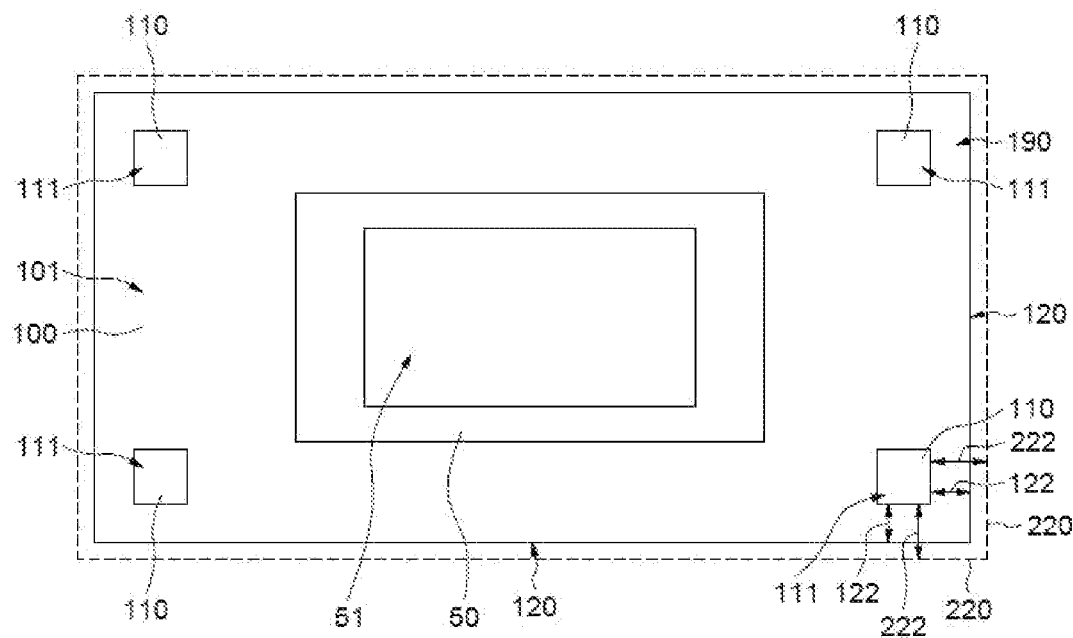
FIG. 4 shows a top view of a carrier substrate.

FIGS. 3 and 4 illustrate another example embodiment of an electronic device DIS comprising an encapsulating cover 200 mounted on a carrier substrate 100 similar to the device described with reference to FIG. 1, and common elements have been referenced with the same references and will not be described in detail again.

FIG. 3 is a cross-sectional view of this other example embodiment and FIG. 4 a top view of the carrier substrate 100 of this example. The top of the carrier substrate 100 is the side of the substrate 100 level with the mounting front face 101, which will make contact with the rear edge 290 of the encapsulating cover 200.

In this embodiment, to define the distance Z between the surface 51 of the chip 50 and the optical system 285, the mounting front face 101 of the carrier substrate 100 comprises a plurality of separate seating protrusions (referred to in this embodiment as "seating bases") 110 that protrude with respect to said mounting front face 101. Said seating bases 110 are configured to be seated in contact with the rear edge 290 of the cover 200.

A front surface 111 of the seating bases 110, which protrudes from the front face 101 parallel to the front face 101, forms the seating surface 300 in contact with the cover 200.

The cover 200 does not necessarily comprise seating feet 210 as described above with reference to FIGS. 1 and 2.

The cover 200 may nevertheless comprise shoulders 215 directed towards the interior of the chamber 250 and configured to closely follow the entire front surface 111 of the seating bases 110.

Analogously to the arrangement presented above with reference to FIG. 2, the seating surfaces 300, i.e., the frontal surfaces 111 of the seating bases 110, are located set back towards the interior 122, 222 with respect to the exterior lateral borders 120, 220 of the carrier substrate 100 and of the encapsulating cover 200.

Thus, a free surface 190 open towards the exterior is provided to accommodate the adhesive bead 150 between the seating bases 210 and the exterior borders 120 of the substrate 100.

Figure 5:
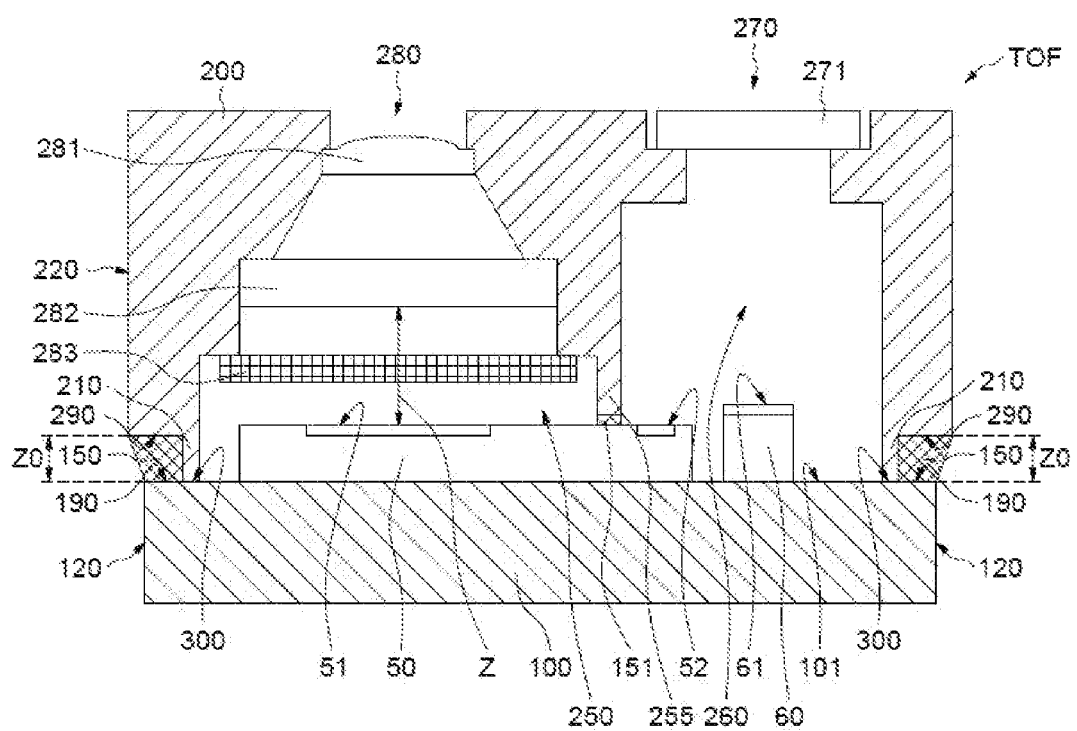
FIG. 5 illustrates an example of an application of a mounting of an encapsulating cover on a carrier substrate.

FIG. 5 illustrates an example of an application of a mounting of an encapsulating cover 200 on a carrier substrate 100 such as described above with reference to FIGS. 1 to 4, in a time-of-flight device TOF.

Elements common with the examples described above have been referenced with the same references and will not be described again in detail here.

The TOF device comprises a light-receiving chip 50 configured to detect an incident light signal, said chip being mounted on the mounting front face 101 of the substrate 100.

A light-emitting electronic integrated circuit (IC) chip 60 configured to emit a light signal is also mounted on the mounting front face 101 of the substrate 100.

The light-receiving electronic chip 50 and the light-emitting chip 60 are housed in a first chamber 250 and second chamber 260 that are provided in the cover 200.

The cover 200 has a through-passage 280 between the exterior of the cover 200 and the first chamber 250, and a complex optical system comprising three elements is housed facing the through-passage 280.

The through-passage 280 and the elements of the complex optical system are aligned along a vertical optical axis, i.e. perpendicular to the mounting front face 101, and centered on a first photosensitive surface 51 of the light-receiving chip 50.

The cover 200 has a second through-passage 270 between the exterior of the cover 200 and the second chamber 260, and an optical element 271, for example a protecting window or a filter, is housed facing the second through-passage 270.

The light-emitting chip 60 and the light-receiving chip 50 are configured to interact so as to measure a distance by time-of-flight.

The light-emitting chip 60 is housed in the second chamber 260 of the cover and comprises an emitting zone 61 configured to emit an output light signal for example having a wavelength in the infrared. The light-emitting chip 60 may be configured to emit, in the emitting zone 61, the light signal in all directions, or to emit a laser signal. The output signal passes through the optical element 271 to the exterior of the cover 200.

A reference photosensitive surface 52 of the light-receiving chip 50 is located in the second chamber 260 of the cover and immediately detects the output signal emitted by the light-emitting chip 60, so as to define an emission time of the signal.

The output signal is intended to be reflected or scattered from an element outside the cover 200, and the reflected signal is collected by the complex optical system as an incident light signal coming from outside the cover 200.

The complex optical system is configured to modify the properties of the incident light signal, and in particular to direct it towards the detecting photosensitive surface 51 of the light-receiving chip 50.

The light-receiving chip 50 thus detects a reception time of the reflected signal, and the time passed between the emission time and the reception time is directly proportional to the distance separating the device TOF from the exterior object.

An opaque wall 255 is provided in the cover 200 between the first chamber 250 and the second chamber 260 in order not to bias the detection by the signal emitted by the emitting surface 61. An opaque adhesive bead 151 may fill a potential opening between the wall 255 and the light-receiving chip 50.

The reference photosensitive surface 52 may, for example, be that of a single-photon avalanche diode (SPAD), and the detecting photosensitive surface may comprise those of an array of such SPADs, for example in order to obtain a map of the measured distances.

The complex optical system may, for example, comprise an aspherical first lens 281, a second lens 282 and an optical filter 283 configured to be selectively transparent for a given wavelength range, typically the range comprising the wavelength of the signal emitted by the light-emitting chip 60, the infrared for example.

The complex optical system may have a vertical positioning sensitivity of about 10 μm over the distance Z between an element 282, or a frame of reference of the complex optical system, and the photosensitive surface 51.

Furthermore, because of the presence of the seating feet 210 in the cover 200 making contact with the mounting front face 101 on the seating surface 300, the thickness ZO of the adhesive bead 150 has no or few variations and the mounting is compatible with the constraints of the optical system.

Moreover, the invention is not limited to these embodiments and modes of implementation because it encompasses all the variants thereof; for example, it will be recalled that the shapes and positions of the seating feet 210 and of the seating bases 110 may vary, and the device could comprise both seating feet 210 as described with reference to FIGS. 1 and 2, and simultaneously seating bases 110 as described with reference to FIGS. 3 and 4.

The invention claimed is:

1. A process for fabricating an electronic device, comprising:
   mounting an encapsulating cover on a carrier substrate configured to carry at least one electronic chip and having a front face;
   wherein mounting comprises:
      bringing the encapsulating cover into contact with the carrier substrate through a plurality of seating protrusions spaced apart from each other, each seating protrusion having a seating surface through which said encapsulating cover and said carrier substrate make contact; and
      securely fastening the encapsulating cover to the carrier substrate using at least one adhesive bead placed at locations between the seating protrusions and wherein said at least one adhesive bead is not placed between the seating surface of each seating protrusion and the front face of the carrier substrate.

2. The process according to claim 1, further comprising:
   providing at least one through-passage in the encapsulating cover; and
   housing, in the encapsulating cover, an optical system facing the at least one through-passage, before said mounting.

3. The process according to claim 2, further comprising:
   mounting said at least one electronic chip on the front face and housing said at least one electronic chip in a chamber provided in the encapsulating cover, said optical system configured to modify properties of an incident light signal coming from outside the encapsulating cover and directed towards a surface of the at least one electronic chip in a way dependent on the distance separating the surface of the at least one electronic chip from the optical system.

4. The process according to claim 1, wherein the adhesive bead is placed so as to fill a space located between the seating protrusions, which is located set back towards an interior with respect to an exterior lateral border of the carrier substrate.

5. The process according to claim 1, wherein the adhesive bead is placed so as to fill a space located between the seating protrusions, which is located set back with respect to an exterior lateral border of the encapsulating cover.

6. The process according to claim 1, further comprising:
   producing, in said encapsulating cover, said seating protrusions as seating feet that protrude perpendicularly from a rear edge of said encapsulating cover, each seating foot having a rear surface;
   wherein bringing comprises:
      bringing said rear surface of the seating foot into contact with the carrier substrate; and
      placing said adhesive bead on said rear edge of the encapsulating cover.

7. The process according to claim 1, further comprising:
   producing, in the carrier substrate, said seating protrusions as seating bases that protrude perpendicularly from said mounting front face of the carrier substrate, each seating base having a front surface;
   wherein bringing comprises:
      bringing a rear edge of the encapsulating cover into contact with said front surface of the seating base; and
      placing said adhesive bead on a portion of said mounting front face of the carrier substrate.

8. The process according to claim 1, further comprising:
   mounting a light-emitting electronic chip configured to emit a light signal and a light-receiving electronic chip configured to detect an incident light signal on the mounting front face;
   wherein mounting the encapsulation cover comprises positioning the light-emitting electronic chip and the light-receiving electronic chip in at least one chamber of the encapsulating cover;
   wherein the light-emitting electronic chip and the light-receiving electronic chip are configured to interact so as to measure a distance by time-of-flight of the light signal emitted then incident after a reflection.

9. A process for fabricating an electronic device, comprising:
   providing an encapsulating cover including an exterior lateral border with a rear edge and a plurality of seating feet extending from the rear edge;
   wherein each seating foot includes a seating surface; and
   mounting the encapsulating cover on a carrier substrate configured to carry at least one electronic chip and having a front face;

wherein mounting comprises:
bringing the seating surface of each seating foot into contact with the front face of the carrier substrate; and
then applying an adhesive bead to the rear edge of the exterior lateral border of the encapsulating cover to secure the encapsulating cover to the carrier substrate.

10. The process according to claim 9, wherein the adhesive bead fills a space located between the rear edge of the exterior lateral border of the encapsulating cover and the carrier substrate, said adhesive bead laterally positioned between adjacent seating feet.

11. The process according to claim 9, further comprising:
mounting a light-emitting electronic chip configured to emit a light signal and a light-receiving electronic chip configured to detect an incident light signal on the front face;
wherein mounting the encapsulation cover comprises positioning the light-emitting electronic chip and the light-receiving electronic chip in at least one chamber of the encapsulating cover;
wherein the light-emitting electronic chip and the light-receiving electronic chip are configured to interact so as to measure a distance by time-of-flight of the light signal emitted then incident after a reflection.

12. The process according to claim 9, wherein providing the encapsulating cover comprises:
providing at least one through-passage in the encapsulating cover; and
housing, in the encapsulating cover, an optical system facing the through-passage.

13. A process for fabricating an electronic device, comprising:
providing an encapsulating cover including an exterior lateral border with a rear edge;
providing a carrier substrate having a front face with seating bases that protrude perpendicularly from said front face;
wherein each seating base includes a front surface; and
mounting the encapsulating cover on a carrier substrate configured to carry at least one electronic chip and having a front face;
wherein mounting comprises:
bringing the rear edge of the encapsulating cover into contact with the front surface of each seating base of the carrier substrate; and
then applying an adhesive bead to the rear edge of the exterior lateral border of the encapsulating cover to secure the encapsulating cover to the carrier substrate.

14. The process according to claim 13, wherein the adhesive bead fills a space located between the rear edge of the exterior lateral border of the encapsulating cover and the carrier substrate, said adhesive bead laterally positioned between adjacent seating bases.

15. The process according to claim 13, further comprising:
mounting a light-emitting electronic chip configured to emit a light signal and a light-receiving electronic chip configured to detect an incident light signal on the front face;
wherein mounting the encapsulation cover comprises positioning the light-emitting electronic chip and the light-receiving electronic chip in at least one chamber of the encapsulating cover;
wherein the light-emitting electronic chip and the light-receiving electronic chip are configured to interact so as to measure a distance by time-of-flight of the light signal emitted then incident after a reflection.

16. The process according to claim 13, wherein providing the encapsulating cover comprises:
providing at least one through-passage in the encapsulating cover; and
housing, in the encapsulating cover, an optical system facing the through-passage.

* * * * *